United States Patent
Hwang et al.

(10) Patent No.: US 9,805,913 B2
(45) Date of Patent: Oct. 31, 2017

(54) ION BEAM DIMENSION CONTROL FOR ION IMPLANTATION PROCESS AND APPARATUS, AND ADVANCED PROCESS CONTROL

(71) Applicant: TAIWAN SEMICONDUCTOR MANUFACTURING CO., LTD., Hsin-Chu (TW)

(72) Inventors: Chih-Hong Hwang, New Taipei (TW); Chun-Lin Chang, Jhubei (TW); Nai-Han Cheng, Hsinchu (TW); Chi-Ming Yang, Hsinchu (TW); Chin-Hsiang Lin, Hsin-Chu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 133 days.

(21) Appl. No.: 14/727,957

(22) Filed: Jun. 2, 2015

(65) Prior Publication Data
US 2015/0270103 A1    Sep. 24, 2015

Related U.S. Application Data

(62) Division of application No. 13/463,942, filed on May 4, 2012, now Pat. No. 9,070,534.

(51) Int. Cl.
*H01J 37/317* (2006.01)
*H01L 21/687* (2006.01)
(Continued)

(52) U.S. Cl.
CPC ...... *H01J 37/3171* (2013.01); *H01J 37/1474* (2013.01); *H01J 37/20* (2013.01);
(Continued)

(58) Field of Classification Search
USPC ........................................ 250/492.21, 396 R
See application file for complete search history.

(56) References Cited

U.S. PATENT DOCUMENTS 6,903,350 B1    6/2005  Vanderberg et al.
7,750,323 B1 *  7/2010  Wan ................... H01J 37/3023
                                                          250/396 R
(Continued)

FOREIGN PATENT DOCUMENTS

JP      2005108679 A    4/2005
KR    10-2006-0060553 A  6/2006
(Continued)

OTHER PUBLICATIONS

Official Action dated Aug. 23, 2014 in counterpart Korean Patent Application No. 10-2014-0078185, 17 pages.
(Continued)

*Primary Examiner* — Kiet T Nguyen
(74) *Attorney, Agent, or Firm* — Duane Morris LLP

(57) ABSTRACT

A process control method is provided for ion implantation methods and apparatuses, to produce a high dosage area on a substrate such as may compensate for noted non-uniformities. In an ion implantation tool, separately controllable electrodes are provided as multiple sets of opposed electrodes disposed outside an ion beam. Beam blockers are positionable into the ion beam. Both the electrodes and beam blockers are controllable to reduce the area of the ion beam that is incident upon a substrate. The electrodes and beam blockers also change the position of the reduced-area ion beam incident upon the surface. The speed at which the substrate scans past the ion beam may be dynamically changed during the implantation process to produce various dosage concentrations in the substrate.

19 Claims, 6 Drawing Sheets

(51) Int. Cl.
    *H01L 21/265* (2006.01)
    *H01J 37/302* (2006.01)
    *H01J 37/147* (2006.01)
    *H01J 37/20* (2006.01)

(52) U.S. Cl.
    CPC ...... *H01J 37/3023* (2013.01); *H01J 37/3172* (2013.01); *H01L 21/265* (2013.01); *H01L 21/68764* (2013.01); *H01J 2237/12* (2013.01); *H01J 2237/20228* (2013.01); *H01J 2237/30477* (2013.01); *H01J 2237/30483* (2013.01)

(56) References Cited

U.S. PATENT DOCUMENTS

| | | |
|---|---|---|
| 7,838,849 B2 | 11/2010 | Alcott et al. |
| 2002/0033458 A1 | 3/2002 | Nagano et al. |
| 2005/0199822 A1 | 9/2005 | Saini et al. |
| 2006/0097196 A1* | 5/2006 | Graf ........................ H01J 37/20 250/492.21 |
| 2006/0154457 A1 | 7/2006 | Collins et al. |
| 2007/0108390 A1 | 5/2007 | Radovanov et al. |
| 2007/0187620 A1* | 8/2007 | Jung .................. H01J 37/3172 250/492.21 |
| 2008/0258074 A1 | 10/2008 | Tsukihara et al. |
| 2011/0234928 A1 | 9/2011 | Masuda et al. |
| 2012/0056107 A1 | 3/2012 | Distaso et al. |
| 2012/0056110 A1 | 3/2012 | Distaso et al. |
| 2012/0248324 A1 | 10/2012 | Eisner |

FOREIGN PATENT DOCUMENTS

| | | |
|---|---|---|
| KR | 10-2007-0086877 A | 8/2007 |
| WO | 2006/060124 A2 | 6/2006 |

OTHER PUBLICATIONS

Official Action dated Sep. 13, 2013 in counterpart Korean Patent Application No. 10-2012-0080605, 12 pages.

\* cited by examiner

ION BEAM DIMENSION CONTROL FOR ION IMPLANTATION PROCESS AND APPARATUS, AND ADVANCED PROCESS CONTROL

This application is a division of U.S. patent application Ser. No. 13/463,942, filed May 4, 2012, which is expressly incorporated by reference herein in its entirety.

TECHNICAL FIELD

The disclosure relates to semiconductor manufacturing and more particularly to process control techniques, and apparatuses and methods for ion implantation of semiconductor devices.

BACKGROUND

Semiconductor devices are used extensively in various devices throughout the electronics industry and the world. Semiconductor devices, also known as chips, are fabricated on a substrate that includes hundreds or even thousands of chips. In today's semiconductor manufacturing industry, there is a constant push to increase substrate sizes and decrease feature sizes of the semiconductor devices formed on the substrates. It is critically important to control the uniformity of each processing operation across the substrate. Stated alternatively, it is important that each processing operation is carried out uniformly throughout the entire substrate. It is even more challenging to control uniformity to the required levels as substrate sizes increase and feature sizes decrease.

Non-uniformities do occur in the real world of semiconductor manufacturing, however. Various factors may contribute to the non-uniformities. The non-uniformities may be attributable to various processing operations. Advanced measurement techniques and advanced morphology and analytical equipment enable these non-uniformities to be determined. The non-uniformities may manifest themselves in different film thicknesses across a substrate, in a variation in critical dimension (CD) measurements across a substrate or in various other ways. The non-uniformities can result in hundreds or thousands of non-functional chips on a substrate.

The fabrication of semiconductor devices is a cost-intensive process and it would therefore be desirable to apply advanced process control techniques to compensate for non-uniformities across a substrate and produce functional chips throughout the substrate.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

The disclosure provides for varying the scan speed of a substrate being scanned across an ion beam, in both x and y directions, in an ion implantation tool. The disclosure also provides for controlling the size and location of the area of an ion beam incident upon a surface of a substrate in an ion implantation tool. The ion beam is shaped to control the size and position of the ion beam thereby focusing the highest dopant concentration of the ion beam at a desired location. A substrate scans relative to an ion beam in both the x- and y-directions. The position of the area of the ion beam incident upon the substrate, is adjusted in both the x- and y-directions before or during the implantation process. The substrate scans with variable speeds in both the x- and y-directions in some embodiments. The variable speed enables the production of areas with different dopant concentrations. A slower scan speed produces a higher implant dosage and vice versa. The disclosure provides for rotating the substrate about 90°, in one embodiment, and scanning again in the x-direction with the substrate so rotated.

Figure 1:
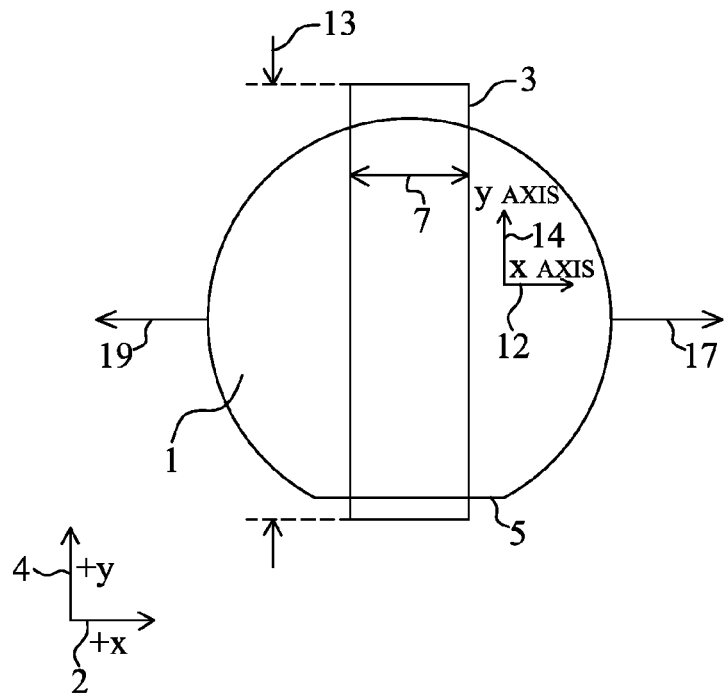
FIG. 1 is a top view showing a substrate translating with respect to an ion beam according to an embodiment of the disclosure.

Referring to FIG. 1, the +x-direction 2 and +y-direction 4 represent the scan direction of substrate 1 within an ion implantation tool. X-axis 12 and y-axis 14 represent the axes of substrate itself. The substrate is scanned with respect to ion beam 3 in both the x-direction 2 and y-direction 4 with variable speeds enabling the implant dosage across the substrate to be varied in both the x-axis 12 and y-axis 14 directions of the substrate. This provides an advantage of advanced process control. The higher concentration of dopant impurities in one area is used to compensate for variations across the substrate resulting from previous processing or anticipated future processing, according to various embodiments. One such variation is CD (critical dimension) variation across a substrate.

FIG. 1 shows a substrate and indicates motion of a substrate relative to an ion beam. FIG. 1 shows substrate 1 in relation to ion beam 3. According to various embodiments, the substrate moves along both the x and y scan directions, i.e. x-direction 2 and y-direction 4, with respect to ion beam 3, with variable speed. In each scan direction, the speed can be increased to provide lesser dosage or increased to provide greater dosage. At the intersection of positions of higher dosage along the x axis 12 and higher dosage along the y axis 14, a significantly increased dosage area is produced.

Substrate 1 is a semiconductor substrate in one embodiment and substrate 1 is formed of other materials suitable as substrates in the semiconductor manufacturing industry, in other embodiments. Substrate 1 represents substrates of various sizes. Various devices (not shown) are formed on substrate 1. The orientation of substrate 1 is indicated by flat 5, positioned downward in the illustration of FIG. 1A. Flat 5 is not used in all embodiments. Note that x-axis 12 and y-axis 14 are presented with respect to flat 5 for convenience of description. Arrows 17, 19 indicate that substrate 1 translates with respect to ion beam 3 in the +x and −x directions respectively, i.e substrate 1 translates along the x direction within an ion implantation tool. Substrate 1 also translates along the y-direction, i.e. along or opposite y-axis 14, i.e. along each of +y and −y orthogonal directions. Ion beam 3 is characterized by dimensions height 13 and width 7 and impinges upon substrate 1 in the z-direction. Height 13 is greater than the diameter of substrate 1. According to this embodiment, the area of ion beam 3 incident upon substrate 1 represents a strip or ribbon of area having width 7 that extends from top to bottom of substrate 1. Various scan speeds are used. The entire substrate 1 passes through ion beam 3 in the embodiment illustrated in FIG. 1, when substrate 1 translates along the x direction, i.e. along +x direction indicated by arrow 17 and −x direction indicated by arrow 19. In other embodiments, the size of ion beam 3 that impinges upon substrate 1, is reduced. In various embodiments, the scan speeds are varied when substrate 1 translates along either or all of the +x-direction indicated by arrow 17, the −x-direction indicated by arrow 19, and the +and −y-directions as indicated by y-axis 14.

Ion beam 3 may be generated by any of various ion implantation tools in various embodiments. Ion beam 3 consists of various ionic species in various embodiments. Ion beam 3 includes various energies used in ion implantation processes and may implant ionic dopant impurities to various dosage levels and various depths.

The x and y directions are provided for convenience of description only and do not require that the movement of substrate 1 within an ion implantation tool is in any particular direction. Rather, the x- and y-coordinates are used to illustrate that ion implantation tools provide an ion beam having a dimension in one direction that can be at least as great as the dimension of the substrate being implanted, and the substrate translates in directions both along and orthogonal to that direction.

Figure 2:
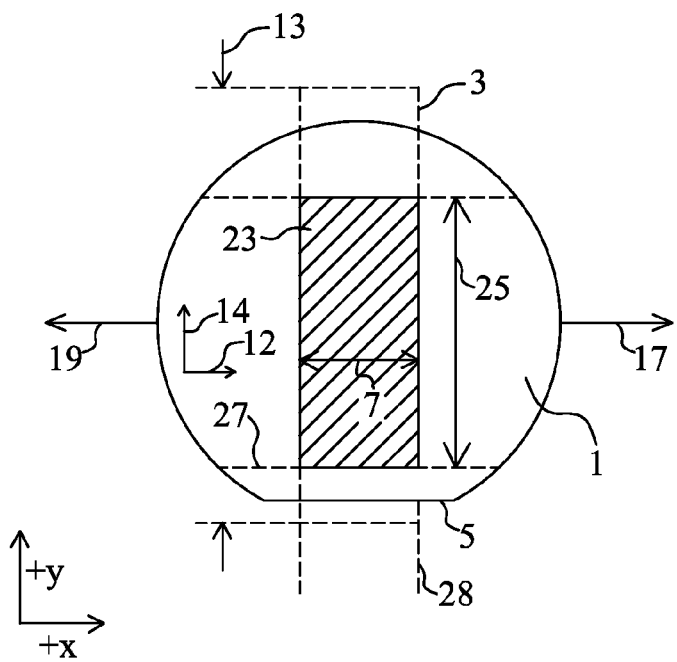
FIG. 2 is a plan view illustrating an embodiment of the disclosure showing a reduction in size of the area on a substrate upon which an ion beam is incident.

FIG. 2 shows substrate 1 and shows a reduced area of the ion beam that is incident upon substrate 1. The maximum area of ion beam 3 that was shown in FIG. 1, is now indicated by dashed lines, i.e. as defined by height 13 and width 7. Various aspects of the disclosure are used to focus ion beam 3 to produce reduced beam area 23 of ion beam 3 incident upon substrate 1. Although ion beam 3 and reduced beam area 23 are both illustrated as being substantially rectangular, this is for illustrative purposes only and in other embodiments, ion beam 3 and reduced beam area 23 take on other shapes. The rectangular presentation in the figures is presented to more clearly show the reduction in size of the ion beam that is incident upon substrate 1. Reduced beam area 23 is defined by width 7 and height 25 and is smaller than an area defined by height 13 and width 7 and each of height 25 and width 7 is less than the diameter of substrate 1. Aspects of the disclosure provide for reducing the size of ion beam 3 incident upon substrate 1 from the original area defined by height 13 and width 7 to reduced beam area 23 and aspects of the disclosure also provide for positioning reduced beam area 23 at a desired location along the y axis. In one embodiment, height 5 differs from height 13 by about 0-50 mm but ion beam 3 may include reduced beam area 23 that varies by different degrees from the original area of ion beam 3, indicated by the dashed lines and defined by height 13 and width 17.

When substrate 1 scans along the x direction, band 27 of substrate 1 receives an implant dosage. When substrate 1 scans along the y-direction 14, band 28 receives an implant dosage. By translating substrate 1 along both the x- and y-directions, the entirety of substrate 1 receives an implant dosage. Reduced beam area 23 allows for the implant dosage to be concentrated at higher or lower concentration levels in the x- and y-directions based on the various speeds at which substrate 1 is translated along both the x- and y-directions. One embodiment of the disclosure provides that at least one of the height and position of the incident area of the ion beam is varied relative to original area defined by height 13 and width 7.

According to one embodiment, height 25 and width 7 is determined and fixed prior to the initiation of the implantation process. In some embodiments, when ion beam 3 achieves reduced beam area 23, it remains at this dimension for an extended time.

According to some embodiments, the exact position of reduced beam area 23 along the x- and y-axes, is changed repeatedly or regularly while substrate 1 is being scanned to produce an ion beam profile area. Various frequencies are used in this embodiment.

According to another embodiment, the scan speed of substrate 1 is varied while being translated along the x-direction, i.e., x-axis 12 and/or while being scanned along the y-direction, i.e., y-axis 14, in the illustrated embodiment. In one embodiment, the scan speed is varied in conjunction with the use of a reduced beam area.

Figure 3:
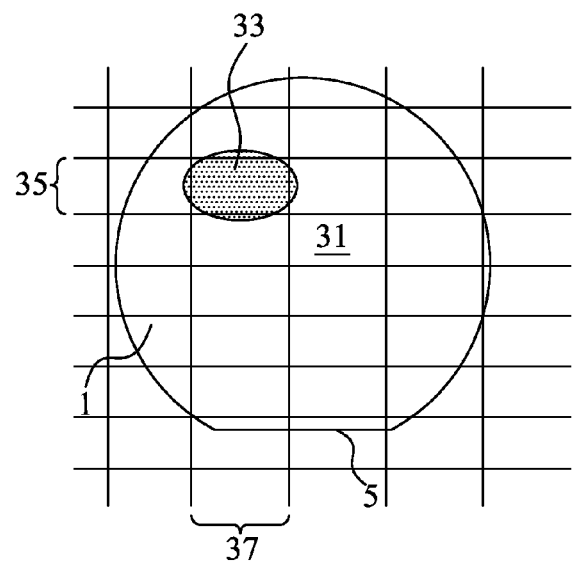
FIG. 3 is a plan view showing a semiconductor substrate with an area of increased dopant concentration according to one process control embodiment of the disclosure.

The method and apparatus of the disclosure are used in one embodiment to produce a concentrated dopant concentration in one area of a substrate such as shown in FIG. 3. The concentrated dopant concentration in a particular area may be used to compensate or correct for non-uniformities such as CD variations or other variations noted across the substrate. This advanced process control technique is useful in providing functional semiconductor devices from chips that would otherwise produce non-functional semiconductor devices.

FIG. 3 shows substrate 1 with implanted surface 31. According to one embodiment, all areas of surface 31 are implanted. Various dopant concentrations are used. High dosage area 33 is part of surface 31 and includes a higher implant dose, i.e. a higher concentration of implanted ions. The relative dopant concentration between high dosage area 33 and other implanted areas of surface 31 varies in various embodiments. High dosage area 33 is formed at any desired location on substrate 1 relative to flat 5. In one embodiment, when substrate 1 scans left-to-right, an increased area of dopant concentration may lie along band 35 due to a reduction of the area of the ion beam incident on substrate 1, and/or the utilization of varying scan speeds in the y-direction. The increased dopant concentration in band 37 and the increased dopant concentration along band 35 may be produced by either or both of a reduced beam area or a slower scan speed along this band when substrate 1 is being scanned in the x-direction relative to the ion beam 3. Bands 35 and 37 of increased dopant concentration together produce high dosage area 33. High dosage area 33 is used to compensate for various variations and non-uniformities on substrate 1 that produce different characteristics in the region of high dosage area 33.

Figure 4:
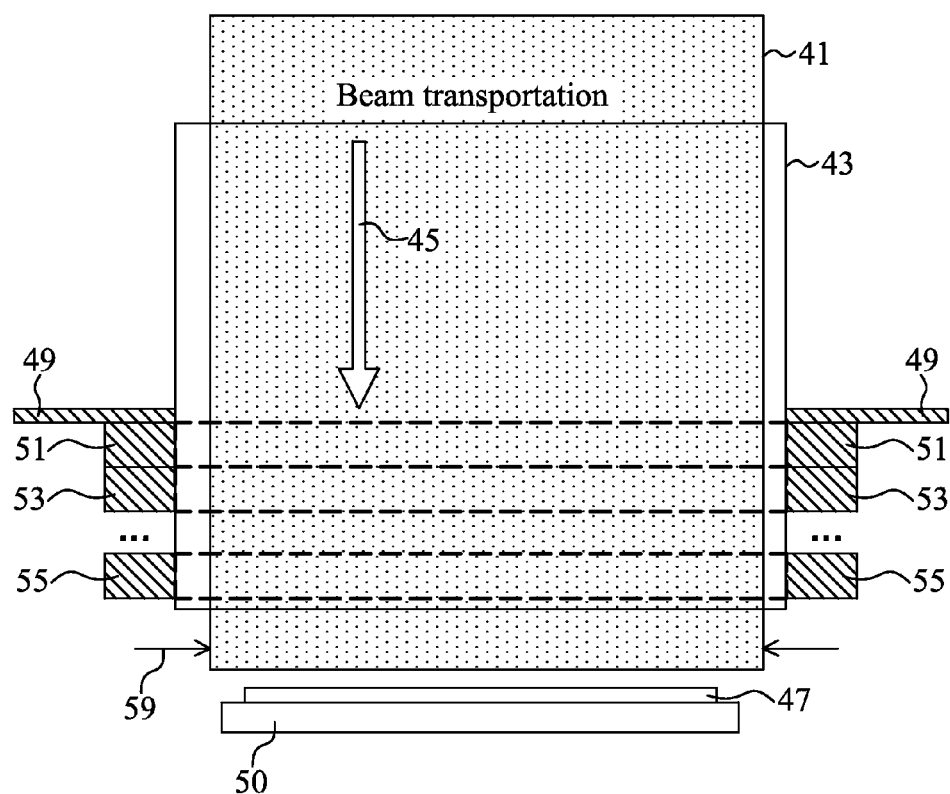
FIG. 4 is a cross-sectional view illustrating aspects of an ion implantation tool according to the disclosure.

FIG. 4 shows ion beam 41 in a beam guide portion 43 of an ion implantation tool. Various ion implantation tools and various ion implantation operations are used to produce ion beam 41 in various embodiments. Beam direction 45 indicates the direction of ion beam 41, i.e. toward substrate 47.

Ion beam 41 impinges upon substrate 47 at about a 90° angle in the illustrated embodiment. In one embodiment, substrate 47 is on moveable stage 50 that moves relative to ion beam 41, both left to right and in and out of the plane of the drawing sheet. Substrate 47 is disposed on a moveable stage 50 within a substrate holder portion of the ion implantation tool in one embodiment. Other suitable means for moving substrate 47 relative to ion beam 41 are used in other embodiments.

The ion implantation tool includes an ion beam generator (not pictured) which may include at least an ion source and an extraction electrode. Various ion sources and extraction electrodes are used. The ion implantation tool may also include one or several magnetic devices or other suitable means that guide ion beam 41 along ion beam direction 45 and toward substrate 47. Electromagnets or other magnets and magnet arrangements are used in various embodiments. The magnetic devices guide ion beam 41 by bending and shaping the beam in various embodiments. FIG. 4 shows a linear portion of ion beam 41 in beam guide portion 43 that is in the vicinity of, and incident upon substrate 47, but ion beam 41 may extend in different directions in other locations of the ion implantation tool.

Ion beam 41 includes width 59 which is illustrated to be greater than the diameter of substrate 47. Width 59 is a dimension along a direction transverse to the scan direction of substrate 47 which is in and out of the drawing page, in one embodiment. Width 59 is comparable to height 13 of beam 3 shown in FIG. 1 which is transverse to one scan direction 17, 19 of substrate 1. Width 59 is maintained in some embodiments in which the scan speed of substrate 47 is varied in orthogonal directions as substrate 47 translates with respect to ion beam 41. In other embodiments (see FIG. 5), width 59 of ion beam 41 is reduced.

Now returning to FIG. 4, width 59 of ion beam 41 is controllable by beam blockers 49 and opposed sets of electrodes 51, 53 and 55. Sets of opposed electrodes 51, 53 and 55 are disposed at various locations along ion beam direction 45. In the illustrated embodiment, sets 51 and 53 are immediately adjacent one another and there is a space between set 53 and set 55. In other embodiments, more or fewer sets of opposed electrodes are used. In other embodiments, the sets of opposed electrodes are disposed at different locations and at various spacings, along ion beam direction 45. Each set of opposed electrodes is separately controllable. More particularly, each electrode of each set of opposed electrodes 51, 53, 55 can be separately biased.

Ion beam 41 deflects in response to an electric field applied across a set of opposed electrodes. In one embodiment, ion beam 41 deflects in response to a positive bias being applied to either or both electrodes of a set. This results in width 59 of ion beam 41 being reduced and the position of the reduced incidence area of ion beam 41 being adjusted, as described above in conjunction with FIG. 1. Beam blockers 49 are positionable to block ion beam 41 from reaching substrate 47. In one embodiment, beam blockers 49 slide linearly inward and into the path of ion beam 41 and in another embodiment, beam blockers 49 are angled or otherwise guided into the path of ion beam 41. In one embodiment, beam blockers 49 are made of graphite but other suitable materials are used in other embodiments. Beam blockers 49 are formed of materials that absorb or block the ionic species in ion beam 41.

Figure 5:
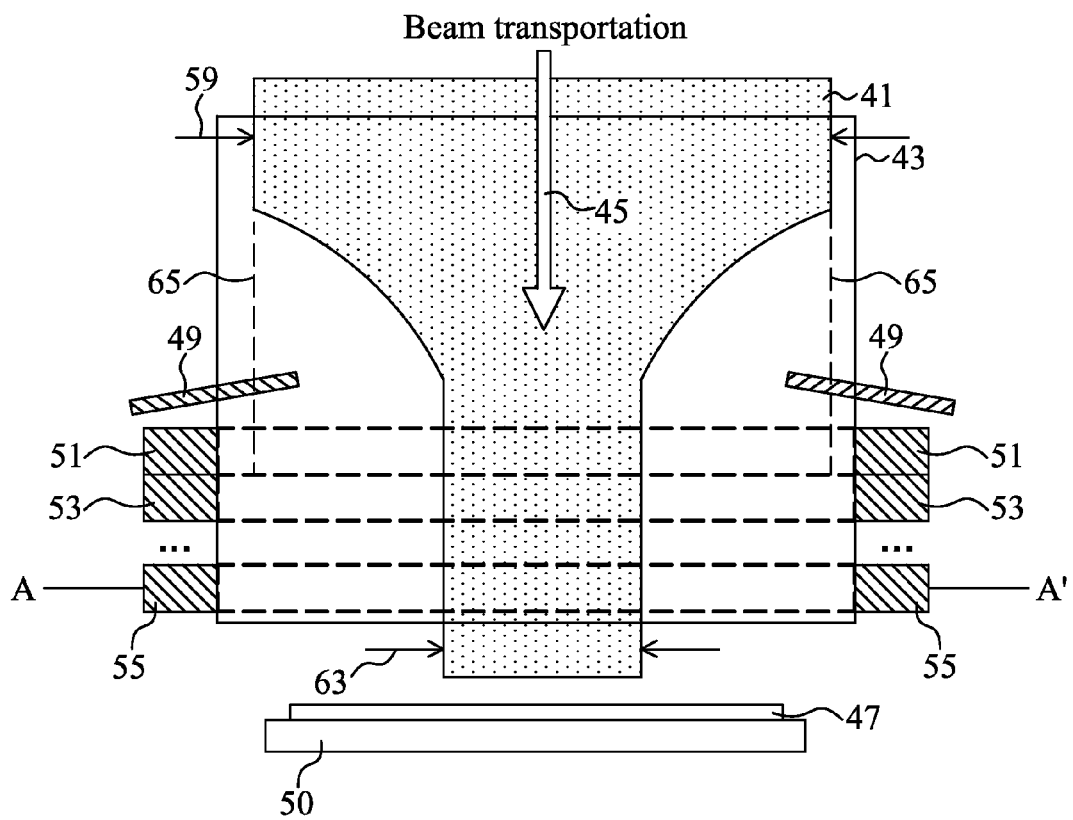
FIG. 5 is a cross-sectional view illustrating aspects of an ion implantation tool according to the disclosure.

FIG. 5 shows ion beam 41 narrowed according to aspects of the invention. Ion beam 41 includes width 59 at locations before ion beam 41 encounters beam blockers 49 and sets of opposed electrodes 51, 53 and 55. The widest possible path of ion beam 41 is indicated by dashed lines 65. Ion beam 41 has reduced width 63 at the location at which ion beam 41 is incident upon substrate 47. In one embodiment, this is brought about by biasing one or more electrodes of one or more of the sets of opposed electrodes 51, 53 and 55. As indicated above, the features of the drawings may be arbitrarily expanded for clarity and to more clearly illustrate aspects of the disclosure, and reduced width 63 may vary from width 59 by various degrees. In one embodiment, width 63 is about 0-50 mm smaller than width 59 but other variations are used in other embodiments. In the illustrated embodiment, ion beam 41 is centrally disposed because each of the opposed electrodes of one or more sets is biased equally. In other embodiments, the portion of ion beam 41 with reduced width may be shifted to the left or right by applying unequal voltages to the respective electrodes of one or more of the sets of electrodes. In one embodiment, all sets of opposed electrodes 51, 53 and 55 are biased and in other embodiments, one or more sets of opposed electrodes 51, 53, 55 are biased.

In another embodiment, the decrease in width of ion beam 41 is attributable to beam blocker 49 being positioned within the original path of ion beam 41. Beam blockers 49 are inserted at various depths into original path 65 of ion beam 41 for various degrees of ion beam area restriction, and are positioned at various locations along ion beam direction 45. In one embodiment, the reduction in width of ion beam 41 is attributable to the use of beam blockers 49; in another embodiment, it is attributable to the use of one or more sets of opposed electrodes 51, 53 and 55 and in yet another embodiment, the reduction in beam width is attributable to both the use of beam blockers 49 and the biasing of one or more sets of opposed electrodes 51, 53 and 55. The position of the reduced-width ion beam 41 may also be determined by beam blockers 49, one or more biased opposed electrodes 51, 53 or 55, or by both beam blockers 49 and one or more opposed electrodes 51, 53 or 55, in various embodiments.

Substrate 47 is in close proximity to the closest set of opposed electrodes 55 to avoid ion beam 41 from becoming wider due to the absence of the electric fields created by the sets of opposed electrodes and/or beam blockers 49. In one embodiment, substrate 47 is no more than 100 cm from the end of beam guide portion 43.

The value of reduced width 63 is determined and effectuated prior to carrying out the ion implantation process, in one embodiment.

Figure 6:
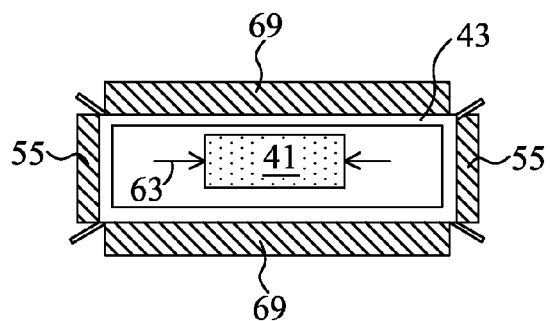
FIG. 6 is a plan view taken along line A-A' of FIG. 5.

FIG. 6 is a cross-sectional view taken along line A-A' of FIG. 5. FIG. 6 shows ion beam 41 essentially at the location at which it is incident upon or in close proximity to substrate 47. FIG. 6 shows ion beam 41 having width 63 at the cross-sectional location. FIG. 6 also shows opposed electrodes 55 and another set of opposed electrodes 69 which are separately controllable, each set of electrodes disposed external to ion beam 41 and external to beam guide portion 43. Although ion beam 41 includes a substantially rectangular area in FIG. 6, ion beam 41 has other shapes in other embodiments. In other embodiments, the area of ion beam 41 at the illustrated location has other sizes. The size is determined by the electric field produced by the bias applied to the respective sets of electrodes 55, 69 in one embodiment. The size may be determined by electric fields applied by biasing one or more of the sets of opposed electrodes 51, 53 and 55 and/or by positioning beam blockers 49. The electric fields produced by set of opposed electrodes 55 is substantially orthogonal to the electric field produced by set of opposed electrodes 69.

The location of ion beam 41 within ion implantation tool 43 is also determined and can be varied by the position of beam blockers 49 and the relative bias applied to the opposed electrodes of a set of opposed electrodes. The position of ion beam 41 is shifted to the left or right or up or down in various embodiments depending on the relative bias applied to the electrodes in one or more of the sets of opposed electrodes. This principle applies to set of opposed electrodes 55, set of opposed electrodes 69 and also the sets of opposed electrodes 51 and 53, not pictured. The relative bias may be fixed in time to fix the position of ion beam 41 within beam guide portion 43. In another embodiment, the relative bias applied to respective electrodes of one or more sets of opposed electrodes alternates or otherwise varies in time to cause the position of ion beam 41 to shift from left to right. In one embodiment, the shift constitutes a sweep across beam guide portion 43 of the ion implantation tool while a substrate is being translated across ion beam 41. When ion beam 41 is swept across ion implantation tool 43, it produces profiles such as shown in FIG. 7A and 7B.

Figure 7A:
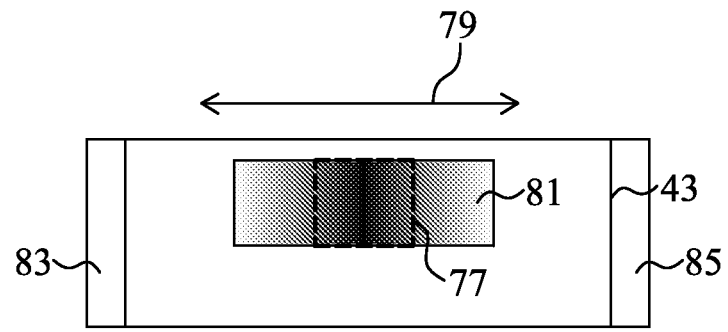
FIGS. 7A and 7B are profiles of ion beam concentration according to an embodiment in which a concentrated area of a beam is swept across a substrate surface.

FIG. 7A shows ion beam 77 positioned within beam guide portion 43. Ion beam 77 is indicated by the dashed line. When ion beam 77 is swept along direction 79, ion beam profile area 81 is produced. The position of ion beam 77 swings side to side by applying an alternating current voltage to opposed left and right electrodes 83, 85, respectively, in one embodiment. FIG. 7B shows ion beam 77 positioned within beam guide portion 43. Ion beam 77 is indicated by the dashed line. When ion beam 77 swings back and forth along direction 91, ion beam profile area 89 is produced. Ion beam 77 is swept side to side by applying an alternating current voltage to opposed upper and lower electrodes 93, 95, respectively, in one embodiment. When ion beam 77 is swept across ion implantation tool 43 and therefore the surface of the substrate being implanted, it may be done at various speeds and the speed may be constant or varying. In some embodiments, when ion beam 77 is being swept back and forth, it remains preferentially in one location for a longer duration than in other locations to produce a higher dopant concentration in the desired location. In one embodiment, ion beam 77 sweeps along both direction 79 and direction 91. In some embodiments, ion beam 77 swings −50 mm in the −x direction and +50 mm in the +x direction, referring to FIG. 7A. Other values are used in other embodiments. The frequency of the beam swing varies in various embodiments and may be 100 Hz in one embodiment. The frequency of the beam swing is chosen to be higher than the scan speed of substrate one in some embodiments. In other embodiments, the swing frequency lies in the range of 1-500 Hz and in some embodiments, the swinging, i.e. sweeping, is sinusoidal in nature. In one embodiment, the speed of the beam swing is 500 cm/sec for an ion implantation operation in which wafer scan speed is about 30 cm/sec. Other relative speeds are used in other embodiments.

Figure 7B:
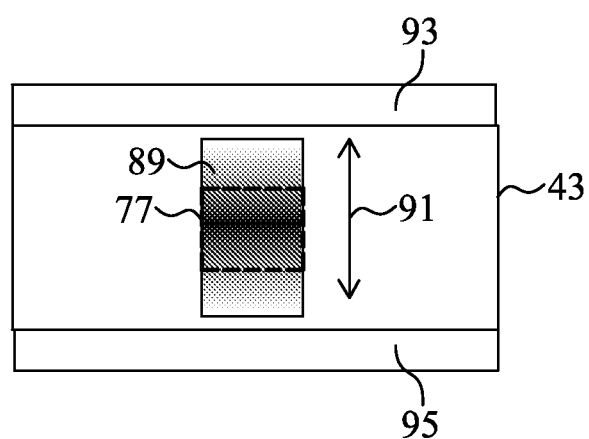

The beam swing shown in FIGS. 7A and 7B are also used in conjunction with varying the scan speed of the substrate relative to the ion beam, in both the x- and y-directions.

FIGS. 8A-8F show exemplary graphs of scan speed being varied in one direction and also show the impact upon the dosage concentration in the substrate, according to one embodiment. It should be understood that the variation in scan speed to produce the different dopant concentration areas shown in FIGS. 8A-8F can be used in both the x- and y-directions, although only illustrated in the y-direction.

Figure 8A:
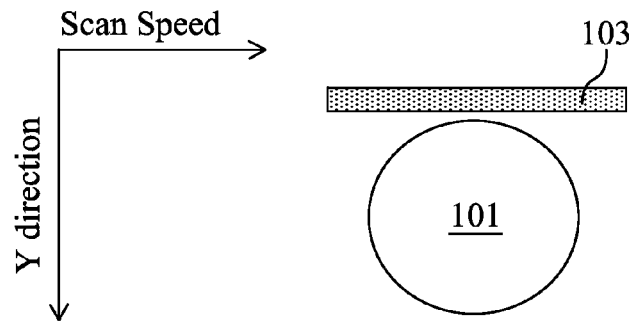
FIGS. 8A-8F show plots of a varying scan speed of a substrate, and the substrate being implanted, in an ion implantation tool.
Figure 8B:
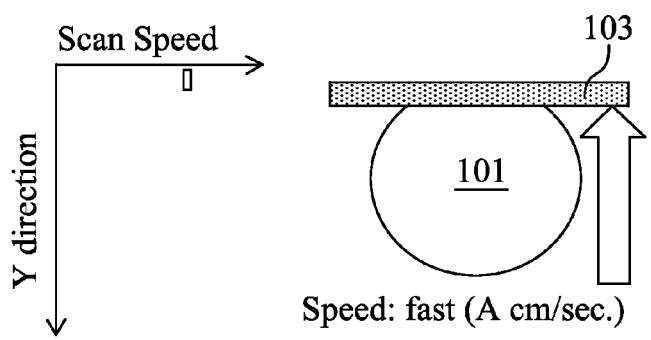
Figure 8C:
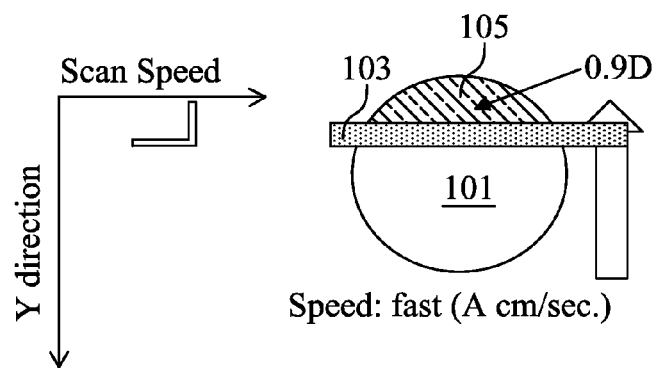
Figure 8D:
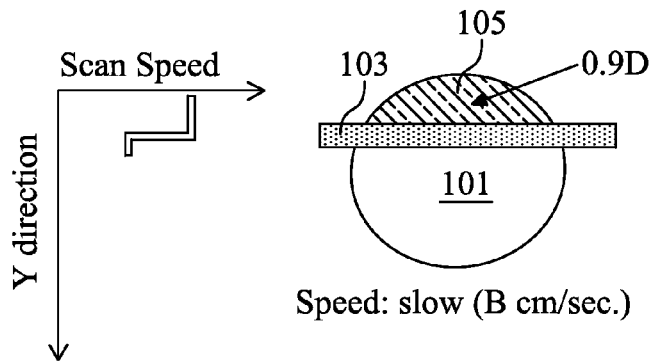
Figure 8E:
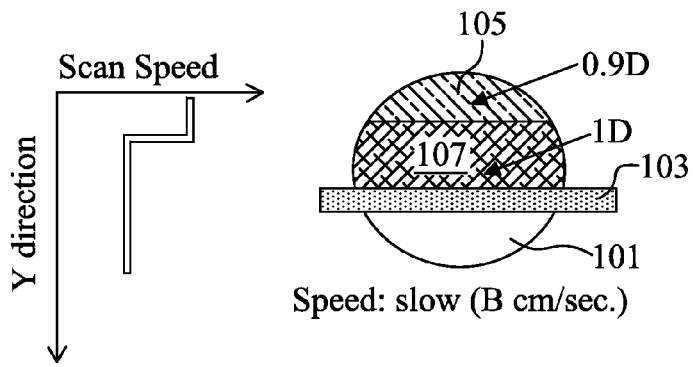
Figure 8F:
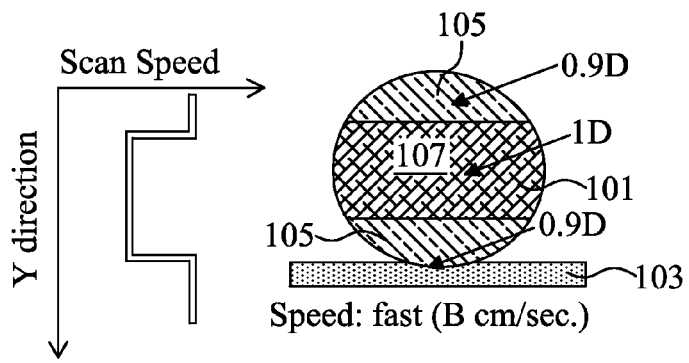

FIG. 8A shows ion beam 103 relative to substrate 101 prior to the scanning operation used to carry out the ion implantation, i.e. scan speed is zero in the accompanying graph. In FIG. 8B, the scanning begins using an initial fast scan speed. Substrate 101 translates, i.e. scans, relative to ion beam 103. The fast scan speed continues through FIG. 8C to produce lower dopant concentration area 105. The scan continues in FIG. 8D at a reduced speed and produces the higher dopant concentration area 107 of FIG. 8E. FIGS. 8D and 8E illustrate the relatively slower scan speed. In FIG. 8F, the scan speed is increased as indicated in the graph and produces lower dopant concentration area 105 on substrate 101. The difference in dopant concentration between higher dopant concentration area 107 and lower dopant concentration area 105 varies in various embodiments. Although ion beam 103 includes a width greater than the diameter of substrate 101 in the embodiment illustrated in FIGS. 8A-8F, in other embodiments as described above, the dimension of the area of ion beam 103 that impinges upon substrate 101 is reduced. Further, the position of ion beam 103 may be moved during the scanning process to produce an ion beam profile area such as shown in FIGS. 7A and 7B, that is impingent upon substrate 101.

The apparatus and techniques described herein are used to produce a customized profile of dopant concentration along a substrate in both the x and y directions. In various embodiments, the customized profile of dopant concentration is tailored to address past and future variations and non-uniformities in the substrate.

In one embodiment, provided is a method for implanting ions into a substrate. The method comprises: generating an ion beam in an ion implantation tool; positioning a substrate on a movable stage in the ion implantation tool such that the ion beam impinges upon the substrate; adjusting dimensions of an area of the ion beam that impinges upon the substrate; and translating the substrate relative to the ion beam, the translating including translating the substrate in each of orthogonal directions.

In another embodiment, an ion implantation tool is provided. The tool comprises: an ion beam generator; at least one magnet device for directing the ion beam towards a stage for receiving a substrate thereon; the stage positioned such that the ion beam is incident upon the substrate in a z-direction when the substrate is on the stage, the stage translatable both in an x-direction and a y-direction with respect to the ion beam; and at least one set of opposed electrodes disposed outside the ion beam and controllable to change size and position of an area of the ion beam incident upon the substrate.

In another embodiment, an ion implantation tool is provided. The ion implantation tool comprises: an ion beam generator; at least one magnet device for directing the ion beam towards a substrate holder; the substrate holder including a moveable stage for receiving a substrate thereon such that the ion beam is incident upon the substrate when the substrate is on the stage, the moveable stage translatable at varying speeds in each of orthogonal directions. The ion implantation tool also comprises a plurality of sets of opposed electrodes disposed outside the ion beam and at different locations along a beam direction of the ion beam, the sets of opposed electrodes separately controllable to change size and shape of the ion beam incident upon the substrate; and a graphite blocker member positionable into a path of the ion beam, and moveable to change the size and shape of the ion beam incident upon the substrate. The moveable stage is adapted to scan the substrate at varying speeds with respect to the ion beam.

The preceding merely illustrates the principles of the disclosure. It will thus be appreciated that those skilled in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those skilled in the art without departing from the scope and range of equivalents of the disclosure.

What is claimed is:

1. A method for implanting ions into a substrate, the method comprising:
   generating an ion beam in an ion implantation tool;
   positioning a substrate on a movable stage in the ion implantation tool such that the ion beam impinges upon the substrate;
   adjusting dimensions of an area of the ion beam that impinges upon the substrate;
   swinging a position of the ion beam back and forth relative to the substrate, by alternately biasing opposed electrodes disposed external to the ion beam, the swinging performed at a first frequency; and
   translating the substrate relative to the ion beam, the translating including translating the substrate in each of two orthogonal directions, wherein the translating is performed at a second frequency in at least one of the two orthogonal directions, and the first frequency is greater than the second frequency.

2. The method as in claim 1, wherein the translating comprises scanning the substrate with respect to the ion beam with varying speeds along each of the orthogonal directions.

3. The method as in claim 1, wherein the adjusting dimensions includes biasing opposed electrodes disposed external to the ion beam.

4. The method as in claim 3, wherein the biasing opposed electrodes comprises separately biasing at least one set of a plurality of sets of opposed electrodes disposed at a plurality of locations along a beam direction of the ion beam, each the set including the opposed electrodes disposed on opposite sides of the ion beam.

5. The method as in claim 4, wherein the biasing at least one set of a plurality of sets of opposed electrodes comprises biasing at least a first set of the plurality of sets of opposed electrodes to produce an electric field along a first direction and biasing at least a second set of the plurality of sets of opposed electrodes to produce an electric field along a direction perpendicular to the first direction.

6. The method as in claim 1, wherein the swinging comprises swinging the ion beam back and forth in both an x-direction and a y-direction to produce an ion beam profile area in the x-direction and the y-direction.

7. The method as in claim 1, wherein the swinging takes place during the translating at a frequency in the range of 1-500 Hz and the adjusting dimensions comprises narrowing the ion beam such that each of a height and width of the area is less than a diameter of the substrate.

8. The method as in claim 1, wherein the translating comprises scanning the substrate with respect to the ion beam with varying speeds in both the x-direction and the y-direction.

9. The method as in claim 1, wherein the adjusting dimensions comprises narrowing the ion beam such that each of a height and width of the area is less than a diameter of the substrate.

10. The method as in claim 1, wherein the adjusting dimensions includes positioning an ion beam blocking member partially in a path of the ion beam.

11. The method as in claim 10, wherein the area of the ion beam is rectangular and dimensions of each of opposed sides of the rectangular area are less than a diameter of the substrate, and the ion beam blocking member is formed of graphite.

12. A method for implanting ions into a substrate, the method comprising:
    positioning a substrate on a movable stage in an ion implantation tool;
    generating an ion beam in the ion implantation tool, such that the ion beam impinges upon the substrate, the ion beam having a beam direction; and
    separately biasing a plurality of sets of opposed electrodes disposed at a plurality of locations along the beam direction, each set including two opposed electrodes disposed on opposite sides of the ion beam having a bias voltage that is varied at a first frequency;
    translating the substrate relative to the ion beam, the translating including translating the substrate in each of two orthogonal directions, wherein the translating is performed at a second frequency in at least one of the two orthogonal directions, and the first frequency is greater than the second frequency.

13. The method of claim 12, further comprising translating the substrate relative to the ion beam, the translating including translating the substrate in each of two orthogonal directions.

14. The method of claim 13, further comprising sweeping the ion beam back and forth in one of an x-direction or a y-direction while translating the substrate in the other of the x-direction and the y-direction.

15. The method of claim 13, wherein the step of separately biasing adjusts dimensions of an area of the ion beam that impinges upon the substrate.

16. The method of claim 12, further comprising positioning opposed blocker members into a path of the ion beam to change a size and shape of the ion beam incident upon the substrate.

17. A method for implanting ions into a substrate, the method comprising:
- positioning a substrate on a movable stage in an ion implantation tool;
- generating an ion beam in the ion implantation tool, such that the ion beam impinges upon the substrate, the ion beam having a beam direction; and
- sweeping the ion beam back and forth in one of an x-direction or a y-direction, by alternately biasing opposed electrodes disposed external to the ion beam, the swinging performed at a first frequency, while translating the substrate in the other of the x-direction or the y-direction the translating performed at a second frequency less than the first frequency.

18. The method of claim 17, further comprising separately biasing at least one set of a plurality of sets of opposed electrodes disposed at a plurality of locations along a beam direction of the ion beam, each the set including the opposed electrodes disposed on opposite sides of the ion beam.

19. The method of claim 18, further comprising positioning opposed blocker members into a path of the ion beam to change a size and shape of the ion beam incident upon the substrate.

* * * * *